(12) United States Patent
Goat et al.

(10) Patent No.: US 7,799,260 B2
(45) Date of Patent: Sep. 21, 2010

(54) METHOD OF POLING FERROELECTRIC MATERIALS

(75) Inventors: Christopher A. Goat, Offham (GB); Michael P. Cooke, Gillingham (GB)

(73) Assignee: Delphi Technologies Holding S.arl, Troy, MI (US)

( * ) Notice: Subject to any disclaimer, the term of this patent is extended or adjusted under 35 U.S.C. 154(b) by 236 days.

(21) Appl. No.: 11/521,183

(22) Filed: Sep. 14, 2006

(65) Prior Publication Data

US 2007/0062025 A1 Mar. 22, 2007

(30) Foreign Application Priority Data

Sep. 16, 2005 (EP) .................................. 05255753

(51) Int. Cl.
 *H05B 6/00* (2006.01)

(52) U.S. Cl. ...................... 264/435; 264/436; 29/25.35; 29/594

(58) Field of Classification Search ................. 264/435, 264/89; 29/25.35, 594

See application file for complete search history.

(56) References Cited

U.S. PATENT DOCUMENTS

| 4,011,474 | A | * | 3/1977 | O'Neill | ....................... 310/328 |
| 4,627,138 | A | * | 12/1986 | Im | ........................... 29/25.35 |
| 4,966,119 | A | * | 10/1990 | Mitsuyasu et al. | ........... 123/498 |
| 6,520,423 | B1 | | 2/2003 | Ricci-Ottati et al. | |
| 6,563,687 | B2 | * | 5/2003 | Kawazoe et al. | ......... 361/301.4 |
| 7,353,585 | B2 | * | 4/2008 | Goat | ........................... 29/594 |
| 2002/0117153 | A1 | | 8/2002 | Zumstrull | |
| 2002/0166620 | A1 | | 11/2002 | Scheinbeim et al. | |

FOREIGN PATENT DOCUMENTS

| DE | 19756182 | 12/1997 |
| EP | 0061374 | 3/1982 |
| JP | 2163983 | 6/1990 |
| WO | WO 03/105247 A2 * | 12/2003 |

* cited by examiner

*Primary Examiner*—Eric Hug
*Assistant Examiner*—Jacob Thomas Minskey
(74) *Attorney, Agent, or Firm*—Thomas N. Twomey

(57) ABSTRACT

A method of poling a ferroelectric sample suitable for use in a fuel injector of an internal combustion engine, the method comprising providing a ferroelectric sample having a stack of ferroelectric layers, wherein adjacent layers are separated by internal electrodes, forming a first group and a second group of electrodes; applying a multiaxial pressure to the ferroelectric sample; and generating an electric field between the first and second group of electrodes to pole the ferroelectric sample. The multiaxial pressure is ideally applied by means of a fluid, and the fluid may be an dielectric fluid or fuel.

20 Claims, 8 Drawing Sheets

METHOD OF POLING FERROELECTRIC MATERIALS

BACKGROUND OF THE INVENTION

The invention relates to a method of poling a sample of ferroelectric material, comprising a plurality of ferroelectric layers arranged in a stack, so as to induce bulk piezoelectricity. In particular, but not exclusively, the invention relates to a method of poling multilayer ferroelectric samples of the type suitable for use in piezoelectric actuators for fuel injection systems for internal combustion engines.

FIG. 1 is a schematic view of a piezoelectric actuator 2 of the type commonly used to actuate a valve needle of a fuel injector 5 (shown in FIG. 2) for a compression ignition internal combustion engine. The actuator 2 includes a poled piezoelectric stack 2a having a plurality of piezoelectric layers 4 separated by a plurality of internal electrodes forming positive and negative electrode groups 6a and 6b respectively. The figure is illustrative only and in practice the stack would include a greater number of layers and electrodes than those shown. Arrows, exemplified by arrows 4a and 4b, between adjacent interdigitated electrodes 6a, 6b indicate the dominant direction of remanent polarisation of the dipoles contained in the piezoelectric layers 4; wherein, the arrow-head of each arrow 4a, 4b indicates the position of the negative pole of each dipole, and the arrow-tail indicates the position of the positive pole of each dipole. The arrows are illustrative only and in practice there would be many more dipoles than indicated in the figures.

The electrodes of the positive group 6a are interdigitated with the electrodes of the negative group 6b, with the electrodes of the positive group 6a connecting with a positive external electrode 8a and the electrodes of the negative group 6b connecting with a negative external electrode 8b. The positive and negative external electrodes 8a, 8b receive an applied voltage, in use, that produces an intermittent electric field between adjacent interdigitated electrodes 6a, 6b. The intermittent electric field rapidly varies with respect to its strength. In turn, this causes the stack 2a to extend and contract along the direction of the applied field.

A lower end cap 10b is adjacent to the lowermost piezoelectric layer 4 of the stack 2a and an upper end cap 10a is adjacent to the uppermost piezoelectric layer 4 of the stack 2a. The lower end cap 10b is coupled to an injector valve needle 7 (shown in FIG. 2), either directly or through an intermediate mechanical and/or hydraulic coupling. Thus, as the stack 2a extends and contracts upon application of the electric field, the injector valve needle 7 is caused to move to control injection of pressurised fuel into an associated engine cylinder (not shown).

Referring to FIG. 2, in order to prevent injection of fuel into the cylinder, the injector valve needle 7 securely abuts an injector nozzle seating 15b; thereby preventing fuel from passing through fuel channels 15a in the nozzle 15. This is achieved by applying a voltage of 200V to the electrodes of the positive group 6a which causes the stack 2a to extend. The electrodes of the negative group 6b are maintained at 0V. Due to fuel injection taking a relatively short period of time, the fuel injector needle 7 is engaged with the associated seating 15b in the aforementioned manner for approximately 95% of the fuel injector's operating cycle.

To inject fuel into the cylinder the voltage applied to the electrodes of the positive group 6a is rapidly reduced, thus causing the stack 2a to contract. The amount that the voltage is reduced is dependent on the pressure of the fuel. For example, at a minimum pressure of around 200 bar (such as when the engine is idling) the voltage applied to the electrodes of the positive group 6a will drop to 20V, and at a maximum pressure of around 2000 bar the voltage applied to the electrodes of the positive group 6a will drop to −20V, briefly making the electrodes of the positive group 6a negative.

In order for the piezoelectric actuator 2 to behave in the aforementioned manner, it is necessary to pole the piezoelectric stack 2a. One known process of poling the piezoelectric stack 2a will be described with reference to FIGS. 3 to 5.

An example of an unpoled multilayer ferroelectric sample of which the piezoelectric stack 2a is comprised is shown schematically in FIG. 3. A multilayer structure 3 is formed from a plurality of relatively thin ferroelectric ceramic layers 4, as in FIG. 1. An example of a ferroelectric material is lead zirconate titanate, also known by those skilled in the art as PZT.

The multilayer structure 3 is poled by applying a potential difference across the positive and negative external electrodes 8a, 8b which, in turn, apply the potential difference across the internal groups of positive and negative electrodes 6a, 6b. In order to achieve poling of the dipoles contained within the piezoelectric material, the dipoles must be exposed to an electric field large enough to cause permanent crystallographic realignment and dipole reorientation. The minimum electric field strength necessary to affect this change is referred to as the "coercive" field strength. Due to the alternating polarity of the internal electric field, the poling direction of the dipoles within the piezoelectric material alternates throughout the structure, as indicated by the arrows, exemplified by arrows 4c and 4d, orthogonal to the internal groups of positive and negative electrodes 6a, 6b in FIG. 4.

A ferroelectric multilayer will only be poled where it is exposed to the coercive electric field. As shown in FIG. 5, once the coercive field has been applied to the multilayer structure 3, the central regions of the ferroelectric layers 4 contained between adjacent oppositely charged electrodes 6a, 6b (shown as central region 14) are poled. However, the ends of the piezoelectric layers 4 contained in the side regions 12 are not subjected to an electric field because adjacent electrodes in these regions are at the same potential; thus, the piezoelectric material in the side regions 12 remains unpoled. This gives rise to a ferroelectric strain discontinuity between the regions of poled and unpoled ceramic, placing the unpoled material in tension and the poled material in compression. This is because when a ferroelectric material is poled, the crystallographic realignment creates a permanent and temporary elongation along the axis of the applied field. In the multilayer structure 3 this elongation only occurs within the interdigitated central region 14. As a result, the poled material is clamped which may reduce actuator stroke. The unpoled material tends to fracture and crack due to the tensile forces created within it by the elongation of the central region 14. These cracks 16 are identified in FIG. 1. Furthermore, longitudinal distortion may occur if the clamping of the poled material by the unpoled material in the side regions 12 is not uniform.

When the actuator is in use, the cracks 16 are worsened due to the repeated tensile strain imposed by the rapidly intermittent electric field which further fatigues the composite structure in the margins. In addition to the temporary elongation of the stack 2a produced by the intermittent field, the permanent and temporary straining of the poled central region 14 causes the end caps 10a, 10b to experience lateral compression and bending which manifests itself as doming of the end caps 10a, 10b; illustrated by the shaded areas of the end caps 10a, 10b.

Ferroelectric materials and their associated poling are discussed further in the Applicant's co-pending patent application EP 1 516 373 A2.

It is an object of the present invention to provide a method of poling a sample of ferroelectric material which removes or alleviates the aforementioned problems.

BRIEF SUMMARY OF THE INVENTION

According to the present invention, there is provided a method of poling a ferroelectric sample suitable for use in a fuel injector of an internal combustion engine, the method comprising: providing a ferroelectric sample having a stack of ferroelectric layers, wherein adjacent layers are separated by internal electrodes, forming a first group and a second group of electrodes; applying a multiaxial pressure to the ferroelectric sample; and generating an electric field between the first and second group of electrodes to pole the ferroelectric sample.

The invention provides the advantage that, when the sample is exposed to multiaxial pressure during poling, uniform permanent crystallographic realignment and dipole orientation occurs.

In a preferred embodiment, the multiaxial pressure is applied by means of a fluid. Additionally, the fluid may be pressurised. The fluid may be a dielectric fluid, for example Fluorinert™ or, alternatively, the fluid may be a fuel, for example diesel.

Preferably, the method further comprises positioning the ferroelectric sample within the fuel injector before generating the electric field between the first and second group of electrodes. This is advantageous as poling the sample within the fuel injector is more convenient and potentially cheaper than poling the sample separately from the injector and then fitting the poled sample into the injector.

The method may further comprise removing the electric field between the first and second group of electrodes before removing the multiaxial pressure from the ferroelectric sample. The electric field may be generated by applying a potential difference between the first and second group of electrodes. Additionally, the first and second group of electrodes may be interdigitated.

In a further embodiment the method may further comprise: providing a first electrode on a first end face of the sample; providing a second electrode on a second end face of the sample, the second face being opposed to the first face; generating an initial electric field between the first and second electrodes, as a first stage of a two-stage poling method; removing the initial electric field between the first and second electrodes; and generating the electric field between the first and second group of electrodes as a second stage of the two-stage poling method. Two-stage poling of the sample advantageously further reduces the ferroelectric strain discontinuity within the sample.

In yet a further embodiment the method may further comprise removing the initial electric field from between the first and second electrodes prior to applying the multiaxial pressure to the ferroelectric sample. Alternatively, the initial electric field may be generated after the multiaxial pressure is applied to the ferroelectric sample. Preferably, the first electrode covers the surface area of the first end face and the second electrode covers the surface area of the second end face. The initial electric field may be generated by applying a potential difference between the first and second electrodes.

BRIEF DESCIPTION OF THE DRAWINGS

The invention will now be described, by way of example only, with reference to the accompanying drawings in which.

DETAILED DESCRIPTION OF THE INVENTION

Figure 6:
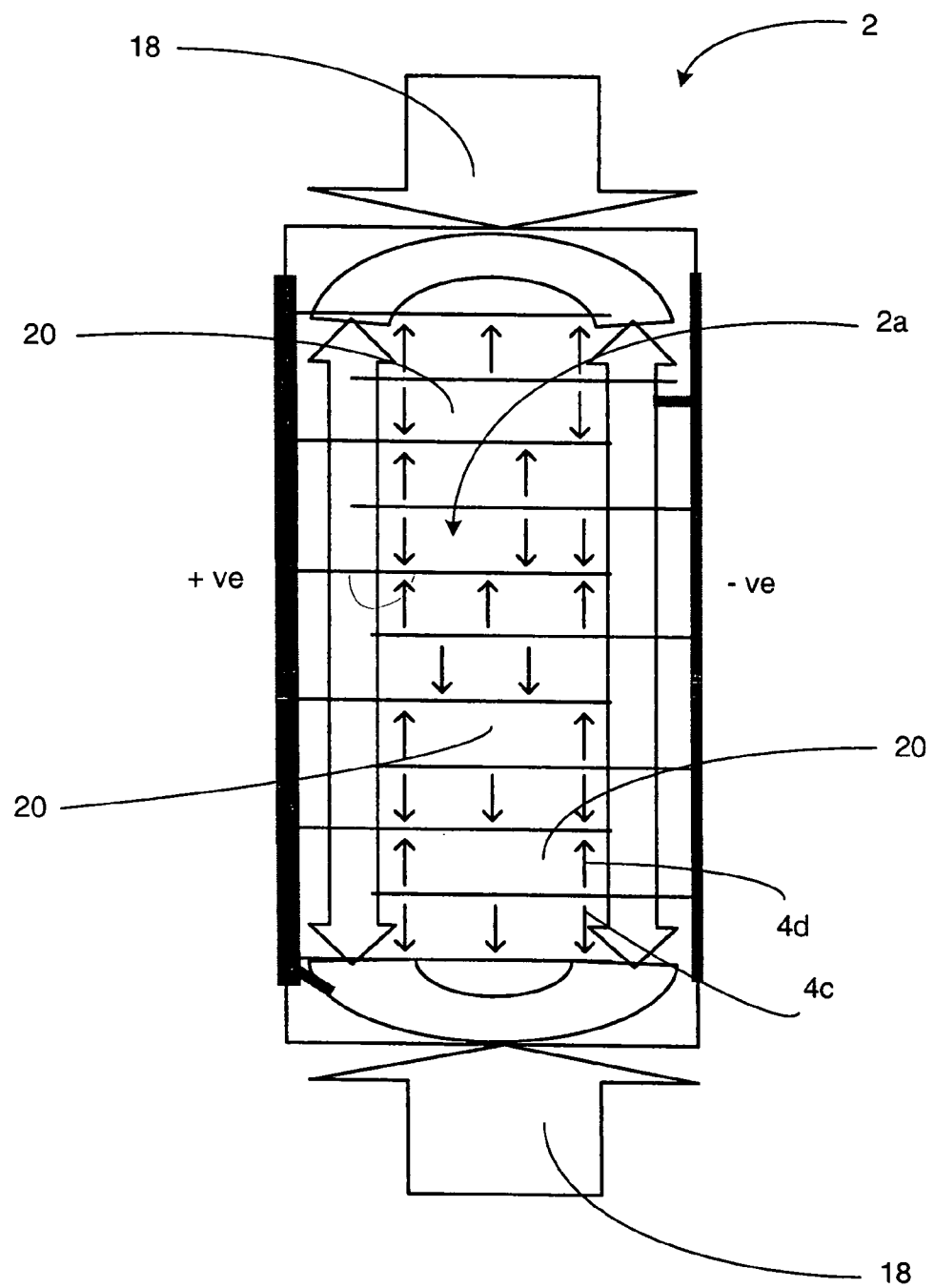
FIG. 6 illustrates a piezoelectric actuator, similar to the actuator of FIG. 1, during a known method of poling, with the poling direction of the dipoles shown schematically throughout the sample.

To address the aforementioned problem of cracking, it has been proposed to apply a uniaxial pressure to the stack $2a$ during poling, as shown in FIG. 6. Pressure is applied to the stack $2a$ along the axis of the electric field, as shown by arrows 18. This pressure partially counteracts elongation of the stack $2a$ so that the elongation strain described previously is limited during poling. Thus, the ferroelectric material's tendency to crack is substantially reduced since the unpoled regions will experience a lower tensile strain. However, the force required to prevent cracking limits dipole reorientation resulting in only partial poling. This is illustrated schematically as gaps 20 in the poling direction of the dipoles in FIG. 6. It is well known to those skilled in the art that the dipoles in an unpoled ferroelectric material are randomly orientated and distributed. Applying pressure to a ferroelectric material along one axis will therefore impede realignment of some of the dipoles along that axis. It has been found that applying a higher electric field to the stack $2a$ mitigates this problem to some extent. However, when the high electric field is removed the uniaxial pressure ferroelastically depoles the ferroelectric material of the stack $2a$.

The present invention provides a method of poling a ferroelectric sample, so that the material is suitable for use in a piezoelectric actuator, where the aforementioned problems are overcome.

Figure 7:
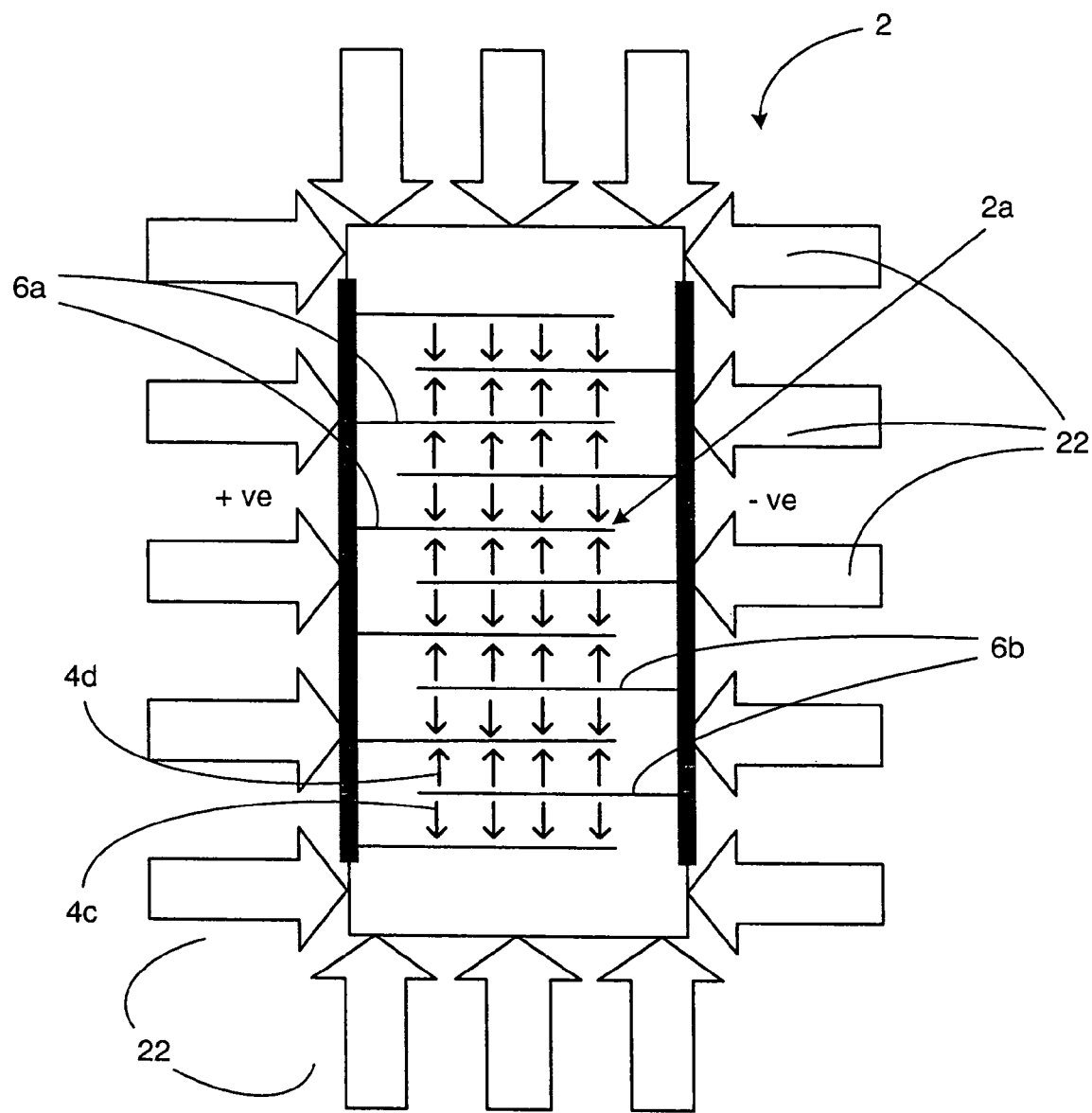
FIG. 7 illustrates a piezoelectric actuator, similar to the actuator of FIG. 1, during poling according to an embodiment of the present invention, with the poling direction of the dipoles shown schematically throughout the sample.

In a first embodiment of the present invention, as shown in FIG. 7, the piezoelectric stack $2a$ is subjected to pressure over its entire surface during the poling process, as indicated by shaded arrows 22, and poled using a single-stage poling process. One way of applying this multiaxial force is to immerse the stack $2a$ in a pressurised fluid. Typically, the fluid used will be a dielectric fluid such as Fluorinert™. While the stack 2a is under hydrostatic pressure, a potential difference large enough to exceed the coercive electric field is applied across the internal positive and negative electrodes 6a, 6b. The coercive electric field strength is typically between 1 and 2 kV/mm. However, raising the temperature of the stack 2a during poling reduces the coercive field strength below 1 kV/mm. After poling has taken place the coercive electric field is removed before the stack 2a is taken out of the pressurised fluid. If the pressure is removed while the coercive electric field is acting on the stack 2a, temporary elongation of the stack 2a will occur, causing cracks to form in the ferroelectric material.

Figure 8:
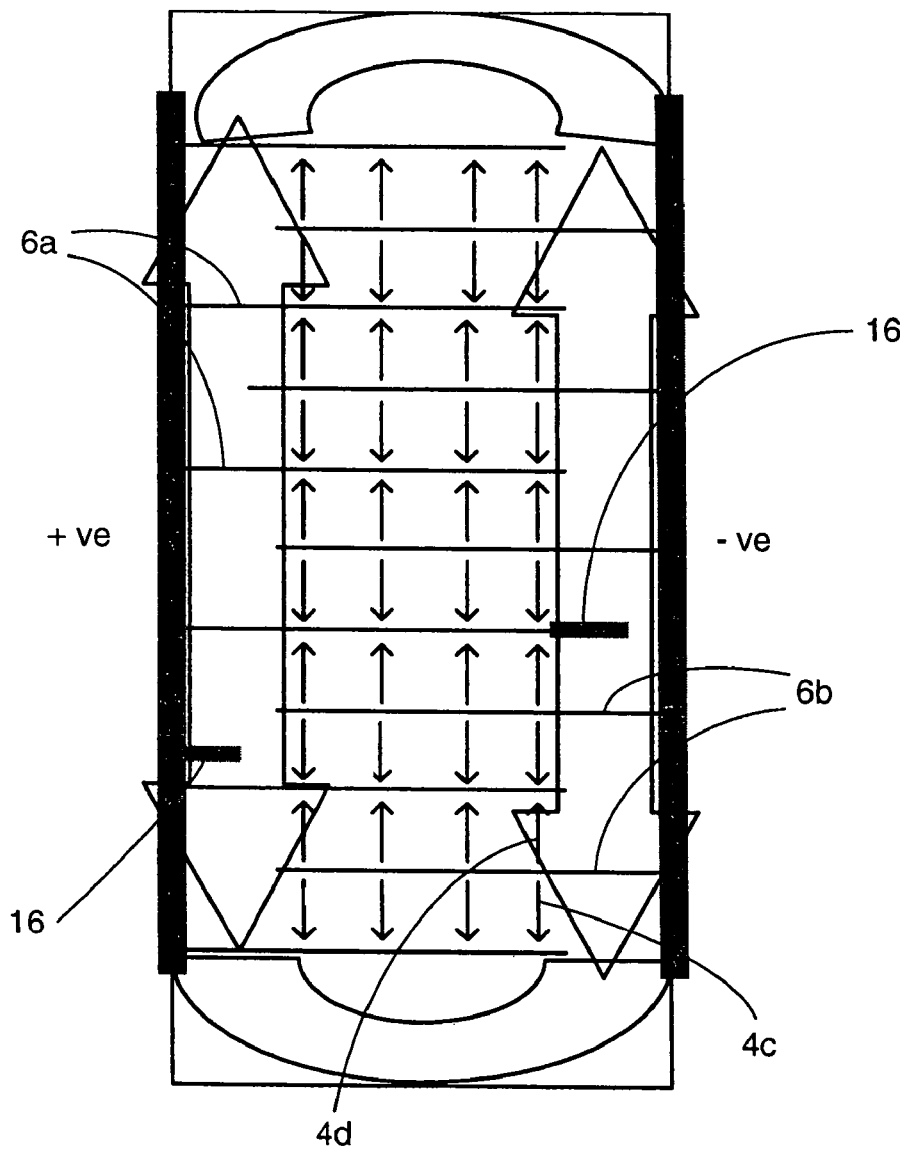
FIG. 8 illustrates the piezoelectric stack of FIG. 7 after single-stage poling.

As can be seen from FIG. 8, applying pressure across the entire surface of the stack 2a produces uniform permanent crystallographic realignment and dipole reorientation and not the partial poling associated with poling the stack 2a under uniaxial pressure. This is illustrated by the uniformity of the arrows, exemplified by arrows 4c and 4d, indicating the poling direction of the dipoles within the piezoelectric material. Uniform realignment occurs because the randomly orientated dipoles are subjected to equal pressure in all directions, so there is no net uniaxial pressure on any dipole producing a force to impede its realignment.

In use, the piezoelectric stack 2a that has been poled using the method of the first embodiment of the present invention is less prone to cracking because the stack 2a is hydrostatically confined; advantageously, the hydrostatic confinement does not impede domain reorientation.

Although less prone to cracking, the piezoelectric stack 2a that has been poled using the first embodiment of the present invention may still be subject to some residual stress. In a second embodiment of the present invention, these stresses are ameliorated and further benefits are gained by immersing the piezoelectric stack 2a in a pressurised fluid, as described above, and then conducting a two-stage poling process.

The first stage of the process comprises attaching an electrode to each of the respective outer faces 11a, 11b of the end caps 10a, 10b of the piezoelectric stack 2a, each electrode being of sufficient cross-sectional area to cover the end caps 10a, 10b. A first coercive electric field is then applied between the electrodes, thereby poling the entire stack 2a, including the side regions 12 and the end caps 10a, 10b. The first coercive field is then removed from the stack 2a while hydrostatic pressure is maintained.

In an alternative embodiment utilising two-stage poling, the first coercive field can be applied without the application of hydrostatic pressure. However, immersion of the stack 2a in a dielectric fluid will reduce the risk of the surface of the stack breaking down. After the first coercive field is removed, a second coercive field is then applied across the internal electrodes 6a, 6b.

The second application of a field exceeding the coercive field creates the alternating poling direction in the stack 2a, as described previously. Therefore, alternate layers of the stack 2a have a coercive electric field acting in the opposite direction to the first coercive field. This causes the dipoles in those layers to undergo poling direction reversal. However, when the two-stage poling process is carried out under uniaxial pressure, as in the prior art, dipole direction reversal is hindered in a similar way to that described previously for single-stage poling under uniaxial pressure. Placing the stack 2a under multiaxial pressure during two-stage poling therefore enables unhindered uniform dipole direction reversal. The hydrostatic pressure will also ensure that the reversing ferroelectric layers remain in compression. This reduces the risk of fracture or delamination of the ferroelectric/internal electrode layers.

Figure 9:
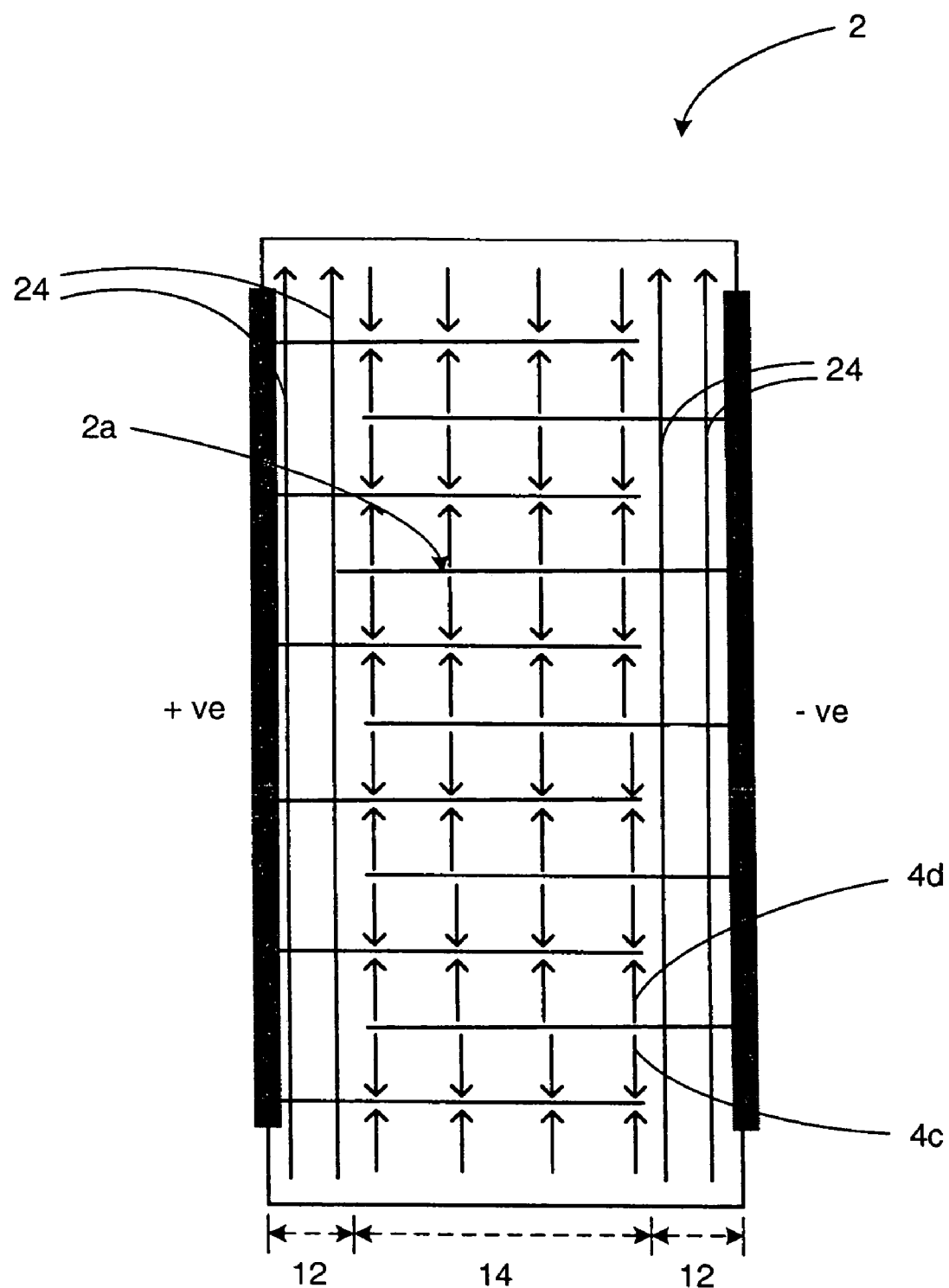
FIG. 9 illustrates the piezoelectric stack of FIG. 7 after two-stage poling.

In addition to poling the piezoelectric stack 2a uniformly, combining two-stage poling with multiaxial pressure produces a smaller ferroelectric strain discontinuity between the side regions 12 and central region 14, further reducing the risk of cracking or delamination. This is because the layers containing the dipoles that have not undergone direction reversal experience the same permanent elongation along the direction of the first coercive field as the ferroelectric material in the side regions 12. This is illustrated in FIG. 9, where arrows 24 indicate the poling direction of the dipoles in the side regions 12 and arrows 4c, 4d indicate the poling direction of the dipoles in the central region 14.

Figure 1:
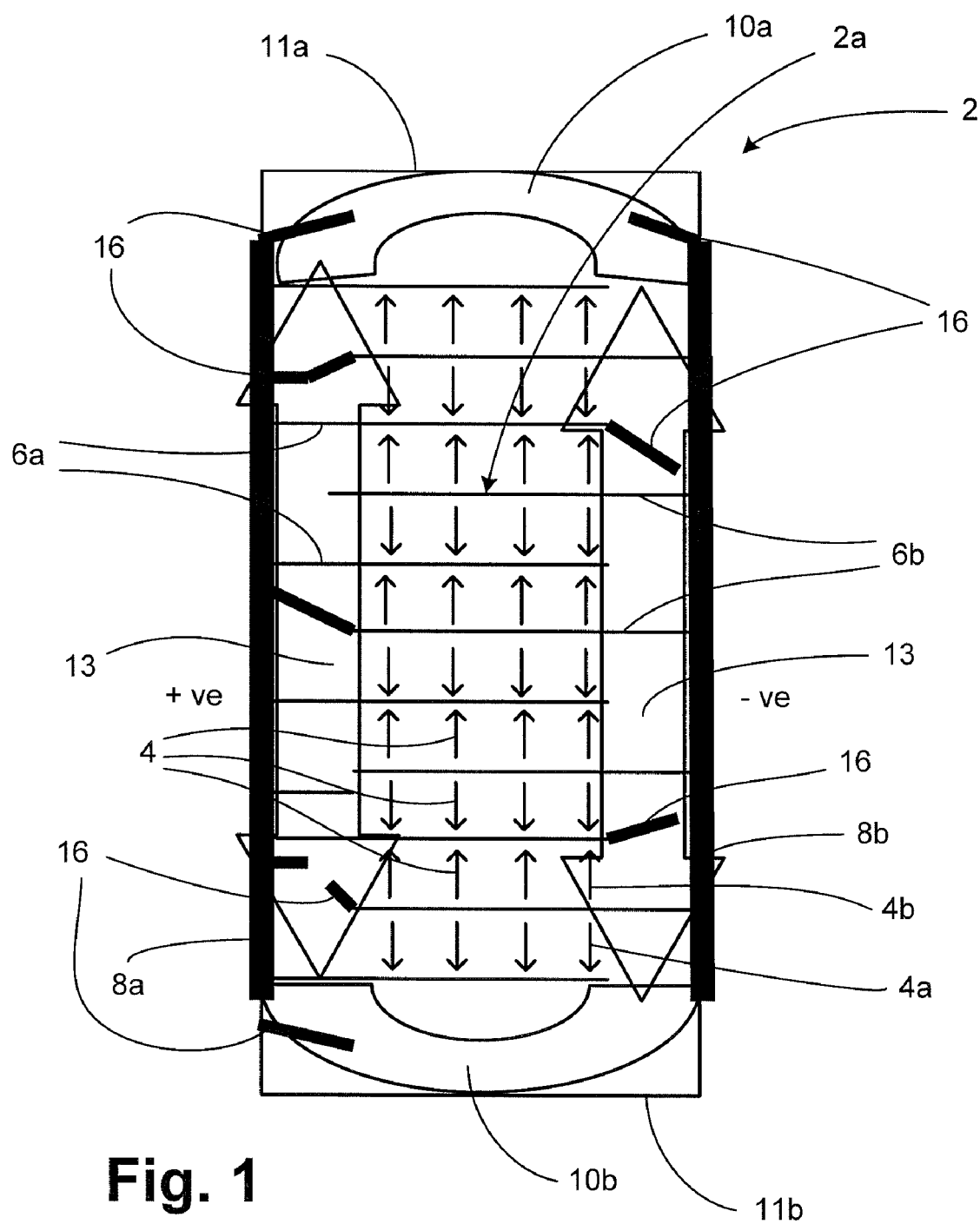
FIG. 1 illustrates a poled piezoelectric actuator for use in a fuel injector comprising piezoelectric layers separated by interdigitated electrodes.
Figure 2:
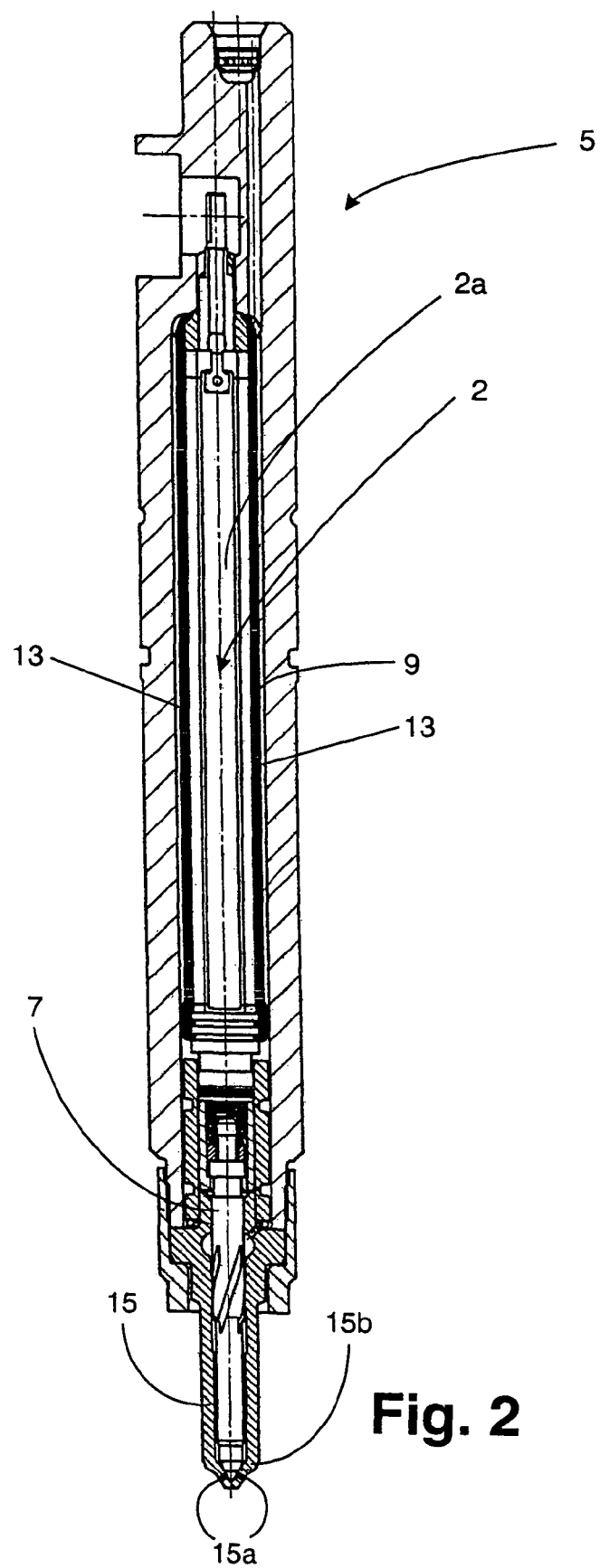
FIG. 2 illustrates a fuel injector for an internal combustion engine of the type in which the piezoelectric actuator of FIG. 1 may be employed.
Figure 3:
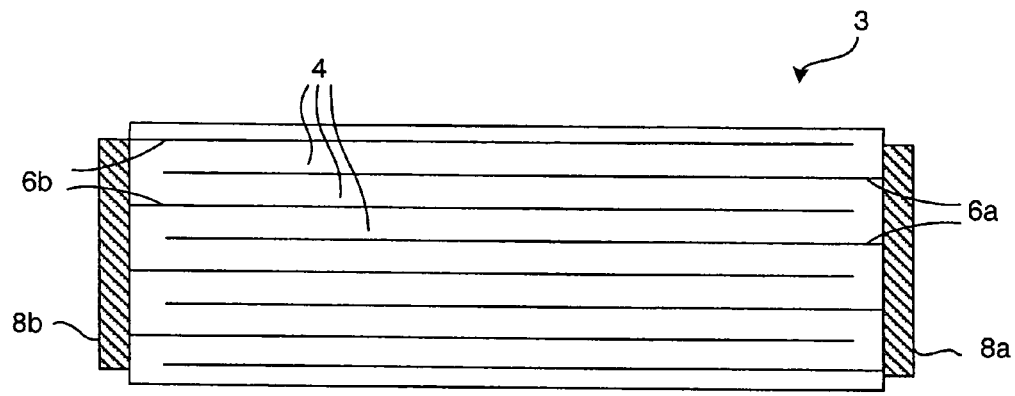
FIG. 3 illustrates an unpoled multilayer ferroelectric sample of which the actuator of FIG. 1 is comprised.
Figure 4:
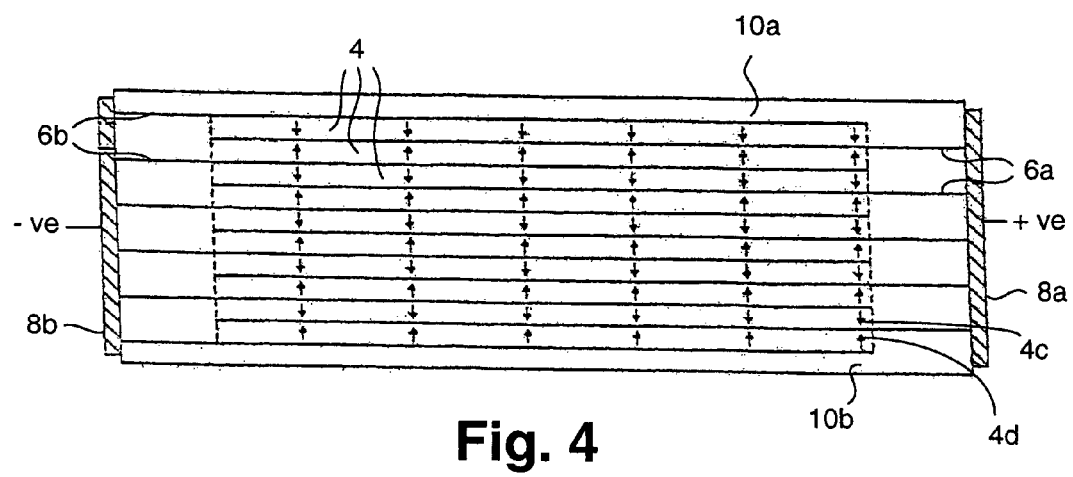
FIG. 4 illustrates the multilayer ferroelectric sample of FIG. 3 after poling, with the poling direction of the dipoles shown schematically throughout the sample.
Figure 5:
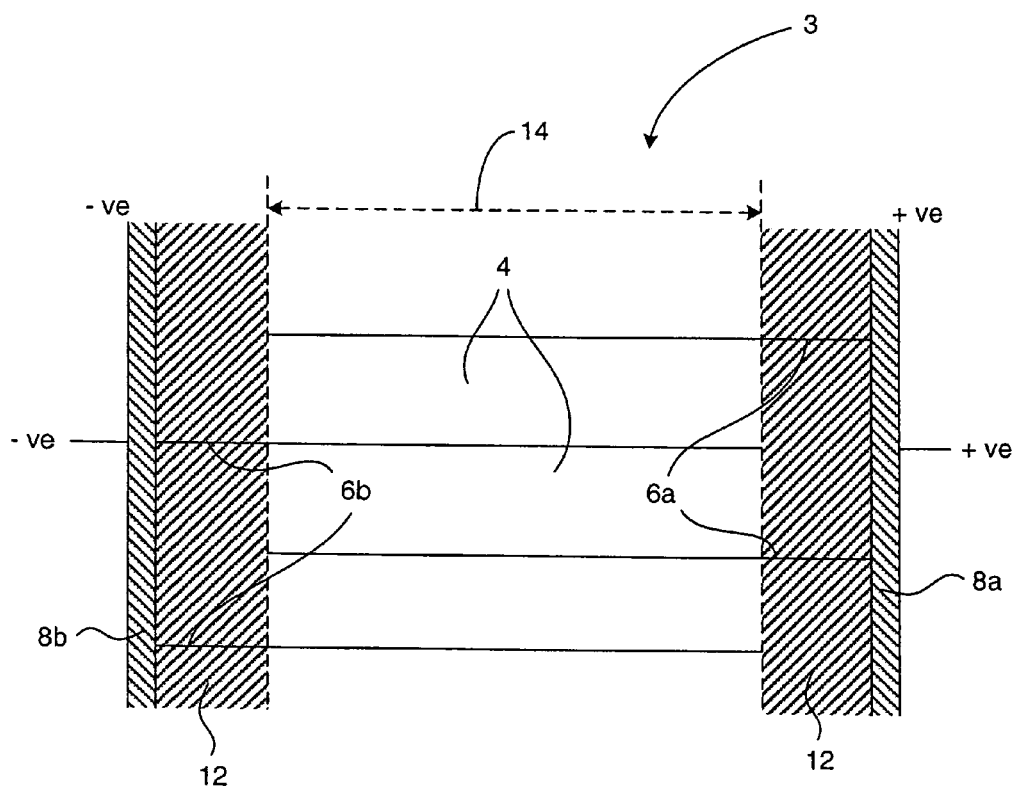
FIG. 5 is an enlarged view of a part of the multilayer sample of FIGS. 3 and 4.

One application of the piezoelectric actuator of the aforementioned type is as an actuator for a fuel injector, such as that described in the Applicant's co-pending European patent application EP 0 995 901 A1 (as shown in FIG. 2). As described previously, here the actuator 2 is housed within a plastic sheath or encapsulation 9 to protect it from its environment. The encased actuator 2 is located within a fuel volume, referred to as the stack volume 13, which in use is filled with fuel at injection pressures.

Poling the piezoelectric stack 2a—whether by single-stage or two-stage poling—under hydrostatic pressure replicates the pressure experienced by the stack 2a in use. As can be appreciated, poling the stack 2a under similar conditions to those experienced in use affords the actuator 2 greater stability and reduces the likelihood of cracks forming while in use. Accordingly, the life of the actuator 2 is increased which provides the injector 5 with greater reliability.

In a third embodiment of the invention, hydrostatic poling of the piezoelectric stack 2a can be integrated with the assembly process of the fuel injector 5, advantageously reducing manufacturing costs and simplifying production. The unpoled stack 2a is fitted in the injector 5 before pressurised fluid, for example diesel or Fluorinert™, is introduced to the stack volume 13. When the stack 2a is fitted in the injector 5, either single-stage poling or the second stage of two-stage poling can take place. Advantageously, during poling and in use, the plastic sheath 9 prevents the external fluid ingressing into the electrodes and/or piezoelectric material of the stack.

The invention may be used in combination with another known technique which prevents surface flash over effects. By applying some form of passivation to the surface of a piezoelectric actuator 2, such as a polymer encapsulation with a relatively high dielectric strength, and then subjecting the actuator 2 to multiaxial pressure, the passivation is pressed into closer contact with the piezoelectric actuator 2, thereby further reducing the risk of surface flashover effects.

The present invention may be embodied in other specific forms without departing from its essential attributes. Accordingly, reference should be made to the appended claims and other general statements herein rather than to the foregoing specific description as indicating the scope of the invention.

The invention claimed is:

1. A method of poling a ferroelectric sample suitable for use in a fuel injector of an internal combustion engine, the method comprising:
   providing a ferroelectric sample having a stack of ferroelectric layers, wherein adjacent layers are separated by internal electrodes, forming a first group and a second group of electrodes;
   applying a multiaxial pressure to the ferroelectric sample; and
   generating an electric field between the first and second group of electrodes while the multiaxial pressure is applied, wherein the electric field is large enough to cause permanent crystallographic realignment and dipole reorientation in regions of the ferroelectric sample;

wherein the multiaxial pressure is sufficient to prevent formation of tensile cracks in regions of the ferroelectric sample that are not exposed to sufficient electric field to undergo permanent crystallographic realignment and dipole reorientation.

2. The method of claim 1, wherein the multiaxial pressure is applied by means of a fluid.

3. The method of claim 2, wherein the fluid is pressurised.

4. The method of claim 2, wherein the fluid is a dielectric fluid.

5. The method of claim 2, wherein the fluid is a fuel.

6. The method of claim 1, wherein the method further comprises positioning the ferroelectric sample within the fuel injector before generating the electric field between the first and second group of electrodes.

7. The method of claim 1, further comprising removing the electric field between the first and second group of electrodes before removing the multiaxial pressure from the ferroelectric sample.

8. The method of claim 1, wherein the electric field is generated by applying a potential difference between the first and second group of electrodes.

9. The method of claim 1, wherein the first and second group of electrodes are interdigitated.

10. The method of claim 1, further comprising:
providing a first electrode on a first end face of the sample;
providing a second electrode on a second end face of the sample, the second face being opposed to the first face;
generating an initial electric field between the first and second electrodes, as a first stage of a two-stage poling method;
removing the initial electric field between the first and second electrodes; and
generating the electric field between the first and second group of electrodes as a second stage of the two-stage poling method.

11. The method of claim 10, further comprising removing the initial electric field from between the first and second electrodes prior to applying the multiaxial pressure to the ferroelectric sample.

12. The method of claim 10, wherein the first electrode covers the surface area of the first end face and the second electrode covers the surface area of the second end face.

13. The method of claim 10, wherein the initial electric field is generated by applying a potential difference between the first and second electrodes.

14. A method of poling a ferroelectric sample suitable for use in a fuel injector of an internal combustion engine, the method comprising:
providing a ferroelectric sample having a stack of ferroelectric layers, wherein adjacent layers are separated by internal electrodes, forming a first group and a second group of electrodes;
positioning the ferroelectric sample within the fuel injector;
applying a multiaxial pressure to the ferroelectric sample; and
generating an electric field between the first and second group of electrodes while the multiaxial pressure is applied, wherein the electric field is large enough to cause permanent crystallographic realignment and dipole reorientation in regions of the ferroelectric sample;
wherein the multiaxial pressure is sufficient to prevent formation of tensile cracks in regions of the ferroelectric sample that are not exposed to sufficient electric field to undergo permanent crystallographic realignment and dipole reorientation.

15. The method of claim 14, wherein the multiaxial pressure is applied by means of a pressurised fluid.

16. The method of claim 15, wherein the fluid is a fuel.

17. A method of poling a ferroelectric sample suitable for use in a fuel injector of an internal combustion engine, the method comprising:
providing a ferroelectric sample having a stack of ferroelectric layers, wherein adjacent layers are separated by internal electrodes, forming a first group and a second group of electrodes;
applying a multiaxial pressure to the ferroelectric sample;
providing a first electrode on a first end face of the ferroelectric sample;
providing a second electrode on a second end face of the ferroelectric sample, the second face being opposed to the first face;
generating an initial electric field between the first and second electrodes;
removing the initial electric field between the first and second electrodes; and
subsequently generating an electric field between the first and second group of electrodes, wherein the electric field is large enough to cause permanent crystallographic realignment and dipole reorientation in regions of the ferroelectric sample;
wherein the multiaxial pressure is sufficient to prevent formation of tensile cracks in regions of the ferroelectric sample that are not exposed to sufficient electric field to undergo permanent crystallographic realignment and dipole reorientation.

18. The method of claim 17, further comprising removing the initial electric field from between the first and second electrodes prior to applying the multiaxial pressure to the ferroelectric sample.

19. The method of claim 17, wherein the first electrode covers the surface area of the first end face and the second electrode covers the surface area of the second end face.

20. The method of claim 17, wherein the initial electric field is generated by applying a potential difference between the first and second electrodes.

* * * * *